(12) United States Patent
Freytag et al.

(10) Patent No.: US 11,709,214 B2
(45) Date of Patent: Jul. 25, 2023

(54) TEMPERATURE-CONTROL SYSTEM FOR MR APPARATUSES WITH A PERMANENT MAGNET ARRANGEMENT

(71) Applicant: BRUKER SWITZERLAND AG, Faellanden (CH)

(72) Inventors: Nicolas Freytag, Binz (CH); Florian Helbing, Zurich (CH); Roger Meister, Hinteregg (CH); Michele Zaffalon, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 17/674,138

(22) Filed: Feb. 17, 2022

(65) Prior Publication Data

US 2022/0171004 A1 Jun. 2, 2022

Related U.S. Application Data

(63) Continuation of application No. PCT/EP2020/072084, filed on Aug. 6, 2020.

(30) Foreign Application Priority Data

Aug. 21, 2019 (DE) ..................... 10 2019 212 508.5

(51) Int. Cl.
*G01R 33/38* (2006.01)
*G01R 33/383* (2006.01)
*G01R 33/3875* (2006.01)

(52) U.S. Cl.
CPC ....... *G01R 33/3804* (2013.01); *G01R 33/383* (2013.01); *G01R 33/3875* (2013.01)

(58) Field of Classification Search
CPC .............. G01R 33/3804; G01R 33/383; G01R 33/3875; G01R 33/46
See application file for complete search history.

(56) References Cited

U.S. PATENT DOCUMENTS 6,489,873 B1 12/2002 Kruip et al.
6,566,880 B1 5/2003 Kruip et al.
(Continued)

FOREIGN PATENT DOCUMENTS

DE 69915316 T2 3/2005
DE 102010002316 A1 8/2011
(Continued)

*Primary Examiner* — Daniel R Miller
(74) *Attorney, Agent, or Firm* — Edell, Shapiro & Finnan, LLC (57) ABSTRACT

A temperature-control system for an NMR magnet system. A permanent magnet arrangement (1) with a central air gap (2) generates a homogeneous static magnetic field inside the air gap. A probehead (3) transmits RF pulses and receives RF signals from a test sample (0). An H0 coil changes the amplitude of the static magnetic field. A shim system (4) in the air gap further homogenizes the magnetic field. A first insulation chamber (5) surrounds and thermally shields the permanent magnet arrangement and includes an arrangement (6) controlling a temperature T1 of the first insulation chamber. The shim system, the H0 coil and the NMR probehead are arranged outside the first insulation chamber in the air gap. A heat-conducting body (7) is arranged between the shim system and the H0 coil on one side and the permanent magnet arrangement on the other, thereby enhancing field stability and suppressing drift.

17 Claims, 5 Drawing Sheets

(56) References Cited

U.S. PATENT DOCUMENTS

| | | | |
|---|---|---|---|
| 6,984,982 B2 | 1/2006 | Huang et al. | |
| 7,297,907 B2 | 11/2007 | Rapoport et al. | |
| 8,030,927 B2 | 10/2011 | Li et al. | |
| 8,461,841 B2 | 6/2013 | Rapoport et al. | |
| 8,624,599 B2 | 1/2014 | Kamlowski et al. | |
| 9,285,441 B1 | 3/2016 | McDowell | |
| 2004/0014236 A1* | 1/2004 | Albo | G01R 33/389 436/173 |
| 2011/0037467 A1 | 2/2011 | Tsuda | |
| 2011/0137589 A1 | 6/2011 | Leskowitz et al. | |
| 2013/0207657 A1 | 8/2013 | Leskowitz et al. | |
| 2014/0084928 A1* | 3/2014 | Gisler | G01R 33/31 324/321 |
| 2016/0077176 A1 | 3/2016 | Rabinovitz et al. | |
| 2018/0038924 A1 | 2/2018 | Rapoport et al. | |

FOREIGN PATENT DOCUMENTS

| | | | |
|---|---|---|---|
| EP | 2507643 A1 | 10/2012 | |
| GB | 1221419 A1 | 2/1971 | |
| GB | 2512328 A * | 10/2014 | G01R 33/3804 |
| GB | 2512328 A | 10/2014 | |
| JP | H03028931 | 4/1991 | |
| JP | H05212012 A | 8/1993 | |
| JP | H05285118 A | 11/1993 | |
| JP | 05337098 A * | 12/1993 | |
| JP | H07003802 | 1/1995 | |
| JP | 2004057832 B2 | 2/2004 | |
| JP | 2004212354 A | 7/2004 | |
| WO | 2000016117 A1 | 3/2000 | |
| WO | 2011066652 A1 | 6/2011 | |

\* cited by examiner

TEMPERATURE-CONTROL SYSTEM FOR MR APPARATUSES WITH A PERMANENT MAGNET ARRANGEMENT

CROSS REFERENCE TO RELATED APPLICATIONS

This is a Continuation of International Application PCT/EP2020/072084 which has an international filing date of Aug. 6, 2020, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2019 212 508.5 filed on Aug. 21, 2019.

FIELD OF THE INVENTION

The invention relates to controlling the temperature of a nuclear magnetic resonance (NMR) magnet system comprising a permanent magnet arrangement having a central air gap for generating a homogeneous static magnetic field in a measuring volume inside the central air gap, an NMR probehead for transmitting radio frequency (RF) pulses and receiving RF signals from a test sample, an NMR frequency lock comprising frequency detection in the NMR probehead and an H0 coil for changing the amplitude of the static magnetic field, and a shim system in the central air gap for further homogenizing the magnetic field in the measuring volume.

BACKGROUND

Such an NMR magnet system, the temperature of which can be controlled, is known from US 2011/0137589 A1 (=reference [1]), for example.

The present invention generally addresses controlling the temperature of permanent magnet systems, in particular for benchtop NMR apparatuses.

In permanent magnets, the magnetic field generated is dependent on the ferromagnetic properties of the permanent magnet material used. These properties are, in turn, heavily dependent on temperature for certain magnetic materials. In neodymium magnets, for example, the coercivity has a temperature coefficient of approx. −0.6%/K and the remanence has a temperature coefficient of approx. 0.1%/K. Therefore, in particular when using permanent magnet arrangements for high-resolution NMR with subhertz linewidths, it is important to thermally control the permanent magnet arrangement in a very precise manner. In this case, the temperature (T) is stabilized over a sufficiently long period of time, preferably to minimize temperature fluctuations to $\frac{1}{1000}$ K in order to prevent a drift or fluctuation of the B0 field, which can lead to resonance line broadening in the event of the accumulation of spectra in order to increase the signal-to-noise ratio (S/N) or distortions of line shapes when the magnetic field strengths change over the time period of a single acquisition. At the same time, measuring conditions are intended to be ensured when the magnet temperature is as low as possible, preferably in the region of room temperature (298 K is standard), in order to allow for NMR measurements without controlling the temperature of the sample. If the magnet temperature is decreased further, the resultant B0 field can be maximized, and thermally excited relaxation of the magnet is slowed down. Ideally, the B0 field is intended to be at least 1.5 T, preferably 1.9 T or higher.

Some apparatuses that are currently commercially available do not have a variable test sample temperature, but the test samples are measured at the operating temperature of the magnet. If very warm/cold test samples are introduced, this leads to detrimental B0 homogeneity variations as a result of temperature gradients emerging in the magnet system. Furthermore, the measurement time is extended by the time required to reach a thermal equilibrium in the test samples, which is considerably longer when the temperature is not actively controlled than when using temperature-control gas flows, for example.

According to some publications, instead of a test sample, a vacuum-insulated flow cell is introduced into the benchtop apparatus and the test sample temperature is set and controlled outside the magnet. This leads to considerable losses in the S/N as a result of a reduced test sample volume. Alternatively, flow cells are used that are not thermally insulated. In this case, it is then accepted that the test sample temperature in the measuring region and the outlet may differ considerably from the temperature in the inlet. This can cause major problems, for example if solutions precipitate, for example if they are supersaturated in the region of the magnet temperature.

Specific prior art Magnet temperature control:

U.S. Pat. No. 8,461,841 B2 (=reference [2]) describes an NMR appliance having a permanent magnet, which is brought to the desired temperature with a temperature-control fluid via holes. The magnet temperature is controlled with T-sensors and the flow and the temperature of the fluid are correspondingly adapted. However, precise temperature control in the mK range cannot be achieved using this appliance.

U.S. Pat. No. 6,489,873 B1 (=reference [3]) discloses a temperature-control system for a yoke-based open permanent magnet system, in which the permanent magnet arrangement is mounted so as to be in thermal contact with a C yoke through a multiplicity of thermoelectric heat pump appliances. At least one temperature sensor is connected to an electronic control circuit. Accurate T-control in the mK range is not possible in this appliance either, since it does not comprise a closed chamber.

U.S. Pat. No. 6,566,880 B1 and WO 2000/016117 A1 (=reference [4]) describe magnetic resonance imaging, which is provided with permanent magnet assemblies that are attached to a yoke. The tomograph also comprises gradient coils. Each permanent magnet assembly is in thermal contact with a plate that has a good degree of heat conductivity and is arranged between the permanent magnet assemblies and the gradient coils. Temperature control with temperature sensors, which are connected to the plate and actuate thermoelectric heat pump appliances, is also provided. In this case, too, an open system is in turn provided, the temperature-control appliance intending to delimit the heat input with the gradient circuits.

GB 2512328 A (=reference [5]) describes an NMR system comprising permanent magnets, which is equipped with temperature sensors and the magnets are directly loaded with heat through heating plates. Sensors are attached to different points of the magnet and provide the information to a controller that in turn actuates the heating plates.

U.S. Pat. No. 8,030,927 B2 (=reference [6]) describes an imaging appliance comprising a permanent magnet, wherein a magnet temperature-control apparatus is provided for maintaining the temperature stability inside the magnet. The magnet temperature-control appliance comprises a pipeline and a temperature controller, the pipeline comprising a liquid circulating therein or a gas circulating therein and the temperature controller being connected in series to the pipeline in order to control the temperature of the liquid or the gas. In comparison with references [3] to [5], due to the circulation of fluid, more accurate T-control is possible in this case. However, the input of the gradient or shim coils is not taken into consideration.

Thermal Insulation:

U.S. Pat. No. 7,297,907 B2 (=reference [7]) describes a method for actively thermally insulating an NMR permanent magnet, which is arranged in an envelope ("thermally insulated virtual envelope"), with respect to the sample, which is arranged inside the magnet hole. So-called "active shielding" is used, in which a temperature-control liquid is conducted between the two components to be thermally separated. Furthermore, it is disclosed that the magnet assembly can also comprise passive insulating layers. However, shim coils are described, which can comprise active shim elements that can be positioned directly around the magnets. Therefore, the aim of this arrangement is not to restrict the heat input into the magnet material through currents in the H0 coil and/or the shim coils. Although no temperature values are explicitly mentioned, it is assumed in this construction that large temperature differences between the test sample and the magnets are intended to be thermally separated. However, precise T-control of the magnet is not the focus.

Another magnet configuration is known from US 2013/0207657 A1 (=reference [8]). However, it is not clear from this document that a barrier or piece of insulation, the temperature of which can be controlled, is provided between the test sample and the pole piece or between the pole piece and the magnet material.

Shimming with T-Control:

Electronic shimming of the magnetic field is carried out via a multiplicity of shim coils, which produce different field gradients in the measuring volume when supplied with power.

U.S. Pat. No. 9,285,441 B1 (=reference [9]) describes a magnetic field correction system for NMR applications. In particular, this relates to electronic shimming in order to achieve a homogeneous magnetic field in the field-of-view. Although this document addresses the problem of temperature changes in the magnet and shim systems, in particular a drift in the magnetic field, according to reference [9] this is not remedied by a temperature-control system, but merely by adapting the currents through the shim coils.

US 2011/0037467 A1 (=reference [10]) describes similar solutions to the problems in MR imaging. If the temperature in a shim material varies, the homogeneity of the static magnetic field changes. Therefore, a temperature sensor on the shim is proposed, which sends information to a controller, the controller determining the degree of inhomogeneity therefrom. A temperature-control system for the shims is not provided here either.

T-Control with Heat Pumps and Heat Exchangers:

US 2018/0038924 A1 (=reference [11]) discloses an NMR system for high-temperature measurements. The probehead is provided with a piece of thermal insulation towards the magnet for this purpose. This insulation or thermal barrier comprises a heat sink, for example consisting of heat pipes or heat pumps (thermoelectric cooler) and a piece of thermal insulation in the form of a wall. Furthermore, the temperature of the pole piece of the permanent magnet can be controlled in order to prevent temperature gradients in the magnet. A type of gas flow for controlling the temperature of the test sample (VT gas flow) is also disclosed.

US 2016/0077176 A1 (=reference [12]) describes an NMR probehead cassette, which comprises a first removable connecting body, which is made of a non-magnetic material. The connecting body is reversibly connected to a heat exchanger in order to essentially keep the connecting body at a predetermined temperature. However, it does not address controlling the temperature of the magnet.

In reference [1], cited at the outset, a generic arrangement having the features mentioned at the outset and a method for generating a homogeneous magnetic field are described. It is clear from reference [1] that only the temperature of the magnet is directly controlled. Intermediate layers, in particular between the magnet and/or pole piece and the shim system, for indirect temperature control are not suggested. The appliance described in reference [1] for controlling the temperature of the magnet is (according to the block diagram) only connected to the magnet itself, but not to the shim system or the pole pieces. A thermal encapsulation of the magnet system is not provided either. The document does not go into further detail in regard to the problem of thermal and mechanical coupling.

SUMMARY

In contrast, it is an object of the present invention to improve a temperature-control system for an NMR magnet system of the type described at the outset in as minimally complicated a manner as possible so as to avoid the above-discussed disadvantages of known generic arrangements. In particular, the NMR appliance that is improved by the present invention is intended to make it possible 1. to set a variable test sample temperature,
2. to make large changes to shim currents within a short period of time without the magnet system drifting for a long time,
3. to be able to make rapid changes to currents in an H0 coil as well as to allow for a large maximum amplitude of the lock range without the magnet system reacting thereto with a slow drift and modified field gradients,
4. to achieve increased field stability in comparison with the apparatuses according to the prior art, in particular when changing test samples,
5. to control the temperature of the permanent magnet such that a constant temperature or, if necessary, stable temperature gradient is made possible in the magnet, in particular irrespective of heat that is input due to shim currents or in the region of the measuring chamber, i.e., on the inside of the permanent magnet, where it is crucial for the field stability, as well as to control the temperature irrespective of heat input from external influences, such as the room temperature or solar radiation on the apparatus.

BRIEF DESCRIPTION OF THE INVENTION

This object—which is relatively demanding and complex when viewed in detail—is achieved in accordance with the present invention in a just as surprisingly simple and effective manner in that a first insulation chamber in a temperature-control system for an NMR magnet system of the type defined at the outset surrounds the permanent magnet arrangement so as to thermally shield it, in that the first insulation chamber comprises one or more arrangements controlling a temperature T1 of the first insulation chamber (but not the shim system, the H0 coil and the NMR probehead, which are arranged outside the first insulation chamber in the central air gap), and in that at least one heat-conducting body is arranged between the shim system and the H0 coil on one hand and the permanent magnet arrangement on the other hand.

The present invention relates, in large measure, to achieving as "sensitive" a temperature control of the permanent magnet system as possible—accurate to a few mK.

According to the invention, this aim is achieved in particular by an NMR magnet system, in which the permanent magnet is arranged in an internally and externally closed system. The magnet is completely surrounded by an isothermal wall and therefore remains unaffected by the input of heat from different sides as a result of active shielding. The permanent magnet has an inner contour, in which the shim system, the H0 coil and the NMR probe head are arranged, having a cross section that is rectangular, polyhedral, elliptical or round, at least in portions.

The arrangement controlling the temperature T1 is located on the wall of the first insulation chamber such that the heat is transferred towards the magnet on the basis of radiation, heat conduction in the gas and possible convection in the chamber with a degree of inertia of the type of a low-pass system. The arrangement is preferably formed by heating foils that are mounted on the surface of the outer wall so as to cover a large surface area thereof. Alternatively, the wall is designed as an effective thermal conductor and is merely locally loaded with heat that propagates through the wall.

The material of the inner wall, i.e., the face of the first insulation chamber that abuts the inner contour of the magnet arrangement, is preferably made of a material that has good heat conduction and/or abuts the heat-conducting body. Ideally, at least part of this face comprises the heat-conducting body. This is advantageous for homogeneously distributing the heat in the interior of the first insulation chamber and allows for thermal control via sources/sinks outside the air gap. In particular, this is advantageous when heat is input locally, such as by dissipation in shim coils or the H0 coil.

The heat-conducting body functions as a thermal shield for the magnet and actively controls the temperature of the inner wall and the inner contour of the magnet arrangement using the temperature T2 of the heat-conducting body.

The magnet temperature is controlled indirectly, since the magnet is intended to only have a few contact points of low thermal conductivity with the wall (i.e., the fastening points of the magnet with respect to the housing). The magnet temperature is preferably between 15° C. and 35° C.

The average temperature of the magnet itself is set to a temperature TM, for which $T1<TM<T2$ or $T1>TM>T2$, if $T1 \neq T2$ and $TM=T1=T2$ if $T1=T2$. TM can preferably be accurately set to 0.1 K, in particular to 0.01 K, particularly preferably to 0.001 K. The temperature TR of the room surrounding the MR spectrometer is between a minimum temperature TRmin and a maximum temperature TRmax during operation, i.e., $TRmin \leq TR \leq TRmax$, and for the magnet temperature TM: $TRmin<TM<TRmax$.

In comparison with the prior art, in which the magnet is actively heated to temperatures above the room temperature TR, for example 40° C., the invention can be used to measure test samples at room temperature without additional sample temperature control. As a result, the equilibration time after introducing a test sample is considerably shorter and an NMR measurement can be carried out significantly faster.

Another advantage consists in that, after installation (i.e., after being switched on), the temperature of the NMR spectrometer is controlled more quickly and no longer drifts since the degree of heat conduction of the magnet material is low. It has proven to be largely advantageous that the target temperature of the magnet can therefore be kept as close to the storage temperature of the switched-off measuring apparatus as possible.

An important difference between the invention and known apparatuses relates to controlling the temperature T2 of the heat-conducting body, which is "seen" from the inner contour of the magnet. Furthermore, it is novel to provide a piece of thermal insulation between the sample temperature-control chamber and the shim system. It is clear from the above-cited documents that, in the apparatuses according to the prior art, the piece of insulation is placed between the test sample and the inner wall of the sample temperature-control chamber, but especially inside the transmitter/receiver coil.

Preferred Embodiments and Developments of the Invention

An embodiment of the temperature-control system according to the invention in which one or more arrangement controlling a temperature T2 of the heat-conducting body is arranged outside the first insulation chamber is particularly preferable. The central air gap corresponds to the hole in the magnet, in the center of which the probehead comprising the measuring chamber and the RF coil is arranged. The shim system comprising the integrated H0 coil is arranged on the radial outside, which is arranged adjacently to the permanent magnet arrangement. The generation of heat by through the currents of the shim system and the H0 coil is removed by the heat-conducting system and is given off to the environment via the heat exchanger. The temperature-control appliance controls the temperature of the heat-conducting body at the temperature T2. This ensures that the heat input towards the permanent magnet is kept constant, if $T2>T1$ or the heat absorption from the permanent magnet is kept constant if $T1>T2$. Preferably, $T2=T1$, and therefore no temperature variances occur inside the chamber and in particular inside the magnet. In this case, $TM=T1=T2$ and no heat is transferred from the magnet system to the first insulation chamber. This is particularly advantageous since the initial (for example mechanical or ferromagnetic) shimming of the magnet can take place irrespective of the temperature control and possible temperature gradients inside the magnet.

Advantageous developments of this embodiment provide that the first insulation chamber enveloping the permanent magnet arrangement comprises a wall consisting of at least two thermally distinguishable faces, each of which comprises at least one sensor for determining a surface temperature $T1i$ of the face and has independent thermal control.

Also advantageous are embodiments of the invention in which at least one of the arrangements controlling the temperature T1 of the first insulation chamber or the temperature T2 of the heat-conducting body is a thermoelectric element and comprises a heat exchanger. Thermoelectric elements, such as a thermoelectric cooler, allow the temperature T1/T2 to be set in a particularly accurate manner. In particular, they allow for cooling and heating at the same time, which allows for efficient and very rapid control and also make it possible to draw larger amounts of heat out of the system.

Additional advantageous embodiments of the invention are characterized in that the wall of the first insulation chamber is likewise designed as a shielding arrangement for magnetically shielding the magnetic field with respect to an external space, i.e., it is made of one or more ferromagnetic materials, and preferably comprises a piece of passive thermal insulation on the outside of the first insulation chamber. In this case, the wall can also simultaneously constitute an RF shield.

Embodiments of the temperature-control system according to the invention that are characterized in that the heat-conducting body consists of a homogenization body and a heat-conducting device are also advantageous. The homogenization body consists, for example, of a material (Cu) that has good thermal conductivity and is used to distribute the heat over its entire surface as homogenously as possible such that the temperature gradients are minimal.

In preferred developments of these embodiments, the heat-conducting device comprises at least one heatpipe. Heatpipes transport the heat more efficiently than mere heat conductors.

In another preferred development, the homogenization body consists of a heat spreader/3D heat diffuser, i.e., a non-cylindrical heat pipe, which transports heat more efficiently than mere heat conductors and can therefore achieve comparable homogenization together with a smaller installation height.

Alternatively or in addition, in other developments, the homogenization body can be thermally connected to the shim system and the H0 coil. This makes it possible to remove the dissipation of the shim/H0 currents from the air gap of the magnet and contributes to achieving as constant a temperature in the measuring chamber as possible if an appliance for setting the test sample temperature is not provided.

Developments in which at least part of the homogenization body is arranged between the shim system and the permanent magnet arrangement are also preferable.

The homogenization body is therefore predominantly arranged between the shim system and the permanent magnet system so that the temperature $T2$ is uniformly distributed at the adjoining magnet.

Other developments are characterized in that the arrangement controlling the temperature $T2$ in the central air gap comprises a heater and/or a temperature sensor for measuring the temperature $T2$ and/or a thermoelectric element and is thermally connected to the shim system and/or the heat-conducting system.

One class of embodiments of the invention is characterized in that the first insulation chamber is encompassed by a second insulation chamber, which is at a temperature $T3$ and through which the temperature $T3$ inside the second insulation chamber is insulated with respect to the ambient temperature TR outside the second insulation chamber.

As a result of this cascading of insulation chambers, the temperature stability when controlling the temperature $T1$ at the wall of the first chamber and/or the temperature $T2$ of the heat-conducting system is at least one order of magnitude greater than the stability of the temperature in the space $T3$.

In this case, in particular $T3$ is stabilized to better than $\pm 1$ K, preferably to better than $\pm 0.1$ K and $T1$ and $T2$ are stabilized to better than $\pm 0.1$ K, preferably to better than $\pm 0.01$ K, ideally to $\pm 0.001$ K.

In this case: $TRmin \leq T3 \leq TRmax$.

Furthermore, preferably $T1>T3$, since in this case the temperature $T1$ can be controlled by heating to $T3$ with respect to the heat sink and no thermoelectric coolers are required to reach the constant temperature $T1$ of the wall of the first insulation chamber.

In preferred developments of this class of embodiments, a temperature control device is provided for the second insulation chamber, which controls the temperature $T3$ inside the second insulation chamber in relation to the ambient temperature TR outside the second insulation chamber.

The temperature $T1$ of the inner wall of the first temperature-control system and/or the temperature $T2$ of the heat-conducting system is/are preferably lower or higher than the temperature $T3$ in the space, and wherein the temperature difference is in particular at least 2 K. Therefore, the temperatures $T1$ and $T2$ can be controlled very accurately against as constant a background as possible and a constant flow of heat is ensured from the first insulation chamber and the heat-conducting system with respect to the second insulation chamber.

An embodiment in which $T3<T1$ is particularly preferable. In this case, $T1$ can be controlled merely by heating elements and does not have to be done using thermoelectric coolers, since cooling is never required.

If a thermoelectric cooler is used to control the temperature $T2$, the heat exchanger can exchange the heat either for the temperature $T3$ or for the ambient air at room temperature. A configuration in which the temperature is controlled with respect to $T3$ increases the control accuracy due to the cascading, a configuration with control against room temperature makes it difficult to achieve particularly stable control of the temperature $T2$ irrespective of the room temperature and possible heat radiation, for example from sunlight, but allows for large amounts of heat to dissipate efficiently, without thereby risking an increase in the temperature of one or more walls of the first insulation chamber, and in particular large temperature gradients inside the second insulation chamber.

A class of embodiments of the invention in which the probehead comprises one or more arrangements setting the temperature TS of a test sample in the measuring volume, which temperature can be set independently of the temperature $T1/T2$ of the wall enveloping the permanent magnet arrangement, is particularly advantageous. This gas flow is used to control the temperature of the test sample, as a result of which an additional application of temperature is provided in the air gap of the NMR magnet system in addition to the shim coils, which has to be removed by the heat-conducting system.

The temperature TS of the test sample is preferably set to in the range of $-40$ to $+150°$ C. with a temperature-controlled sample temperature-control gas flow (VT gas flow). When changing the test sample temperature, very large changes in the input of heat into the magnetic resonance system occur, which, due to the large degree of inertia of the magnets as a result of poor heat conduction of the magnet material, can lead to very slow changes in the magnetic field strength, but especially the magnetic field homogeneity. A similar situation can also occur when setting the electric shim, but not in the stationary (shimmed) state. Therefore, it is particularly important for efficient operation to decouple this heat source/sink as efficiently as possible from the magnet, which, in the preferred embodiment, is achieved by actively controlling the temperature $T2$ and by the combination of the heat-conducting system and homogenization body.

Developments of this class of embodiments in which an insulation system is arranged between the shim system and at least one RF coil of the NMR probehead are advantageous, wherein a flush gas flow, the temperature of which is controlled at a temperature TF, preferably flows through the NMR probehead, the shim system or the H0 coil.

The sample temperature-control gas flow (VT gas flow) and at least some of the flush gas flow are preferably mixed before leaving the spectrometer.

Alternatively, this insulation system can be designed as a Dewar system, i.e., can be evacuated.

Furthermore, a magnetic resonance spectrometer equipped with the temperature-control system according to the invention can be characterized in that the absolute temporal stability of the temperature T3, at least at the location of a temperature sensor, is in the region of $T3=T3\pm1$ K, preferably ±0.1 K.

The absolute temporal stability of the at least one temperature T1i at least at the location of the particular temperature sensor is in the region $T1i=<T1i>\pm0.1$ K, better still ±0.01 K, ideally ±0.001 K.

The absolute temporal stability of the temperature T2 at least at the location of at least one temperature sensor is in the region of $T1=<T2>\pm0.1$ K, better still ±0.01 K, ideally ±0.001 K.

The relative difference between two temperatures T1i and T1j at the face that envelopes the magnet arrangement is smaller than 1 K, better still smaller than 0.1 K, and ideally smaller than 0.01 K.

As is customary, the NMR probehead comprises a test sample chamber, which receives a test sample during operation and can optionally be made of a material having a low degree of thermal conductivity (for example glass, quartz, Teflon, . . . ). The probehead contains a first transmitter/receiver coil, which encompasses or is encompassed by the test sample chamber. The probe head preferably also comprises a network for tuning different resonant frequencies to the first transmitter/receiver coil.

Furthermore, the probehead optionally comprises a second transmit/receive coil, to which additional frequencies for measuring other NMR active nuclei can be tuned, eventually also a lock frequency. In another embodiment, the probehead contains another test sample comprising a substance that is detected by a second or third transmitter/receiver coil and is used as a reference signal for the lock.

The permanent magnet material is typically neodymium, samarium cobalt, etc., for example, and optionally additionally comprises ferromagnetic material, for example iron, cobalt iron and the like.

The magnet arrangement can typically comprise pole pieces, which are attached to the magnet towards the probehead.

The magnet system and the isothermal wall comprise "an arrangement controlling the temperature", such as heaters, thermoelectric coolers having a heat sink (heat exchanger) or the like.

Additional advantages of the invention can be found in the description and the drawings. Likewise, according to the invention, the above-mentioned features and the features that are yet to be discussed further can be used on their own or as several features in any combinations. The embodiments shown and described are understood as not being an exhaustive list but are instead of exemplary nature for describing the invention.

BRIEF DESCRIPTION OF THE DRAWINGS

The invention is shown in the drawings and will be explained in more detail on the basis of embodiments, in which.

DETAILED DESCRIPTION

Figure 5A:
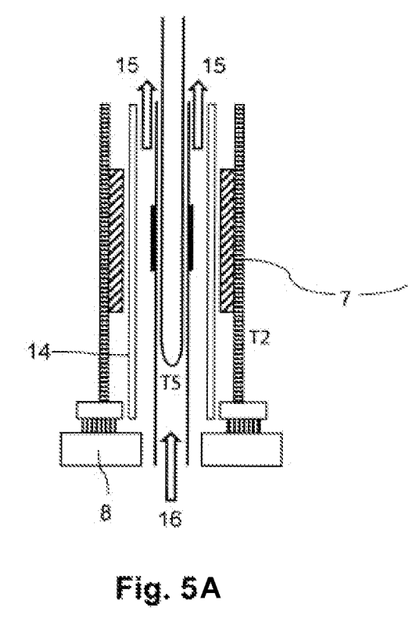
FIGS. 5A and 5B are schematic vertical sections through two respective embodiments of the NMR probehead according to the invention, comprising the thermal insulation system and temperature-controlled flush gas flow and temperature-controlled VT gas flow for controlling the temperature of the sample directly (FIG. 5A) or indirectly (FIG. 5B)
Figure 5B:
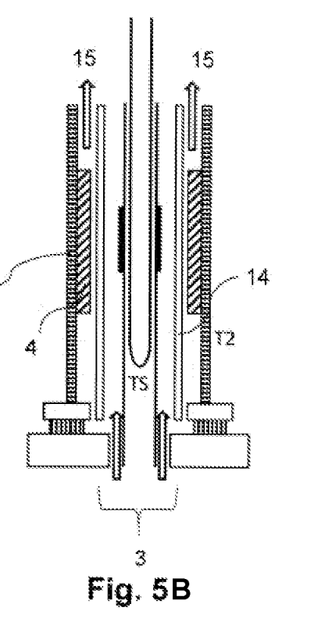
Figure 6A:
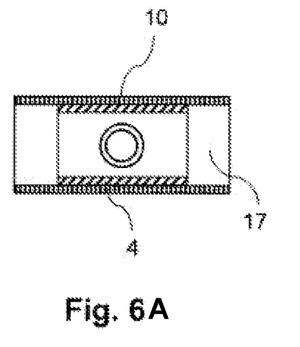
FIGS. 6A, 6B and 6C show cross sections through three respective designs of probeheads comprising a shim system, heat-conducting bodies and homogenization bodies.
Figure 6B:
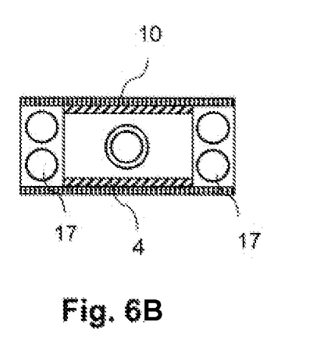
Figure 6C:
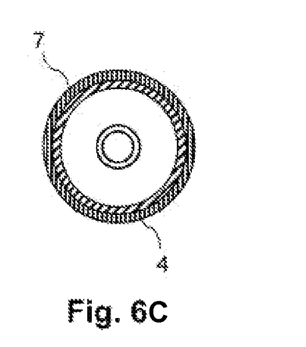
Figure 7:
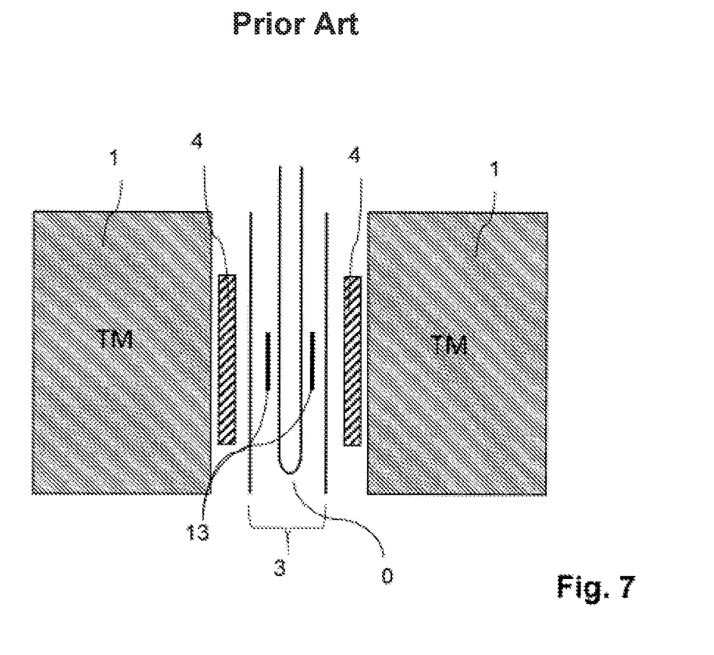
FIG. 7 is a schematic vertical sectional view of a temperature-control system according to the prior art.

FIGS. 1 to 6C of the drawings are each a schematic view of different details of preferred embodiments of the temperature-control system according to the invention, while FIG. 7 shows a generic arrangement according to the prior art.

Such a temperature-control system for an NMR magnet system comprises a permanent magnet arrangement 1 having a central air gap 2 for generating a homogeneous static magnetic field in a measuring volume inside the central air gap 2, an NMR probehead 3 for transmitting RF pulses and receiving RF signals from a test sample 0 via RF coils 13, an NMR frequency lock comprising frequency detection in the NMR probehead 3 and an H0 coil for changing the amplitude of the static magnetic field, and a shim system 4 in the central air gap 3 for further homogenizing the magnetic field in the measuring volume.

Due to a lack of space and for the sake of greater clarity, in all the present patent drawings the H0 coil is not shown specifically and therefore has not been given its own reference numeral either. In the schematic vertical sectional views, the H0 coil spatially (for the viewer) coincides with the schematically depicted shim system 4 in each case.

In such arrangements according to the prior art, the temperature of the permanent magnet arrangement can be directly or indirectly controlled, the waste heat of the shim system and the H0 coil is, however, always directly or indirectly transferred to the magnet since no thermal separation is provided.

The present invention improves these arrangements known per se and expands them by the following elements associated with the invention:

The temperature-control system according to the invention is characterized in that a first insulation chamber 5 surrounds the permanent magnet arrangement 1 so as to thermally shield it, in that the first insulation chamber 5 comprises one or more arrangements 6 controlling a temperature T1 of the first insulation chamber 5, the shim system 4, the H0 coil and the NMR probehead 3 being arranged outside the first insulation chamber 5 in the central air gap 2, and in that at least one heat-conducting body 7 is arranged between the shim system 4 and the H0 coil on one side and the permanent magnet arrangement 1 on the other side.

Figure 1:
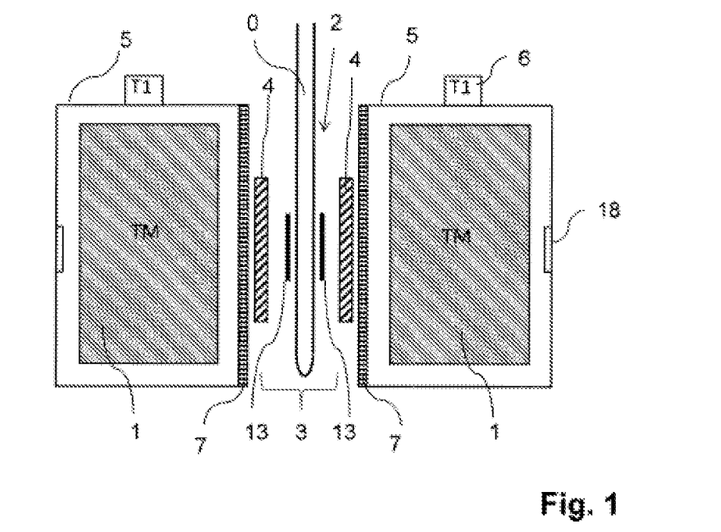
FIG. 1 is a schematic vertical sectional view of a first embodiment of the temperature-control system according to the invention comprising an insulation chamber, a temperature controller and heat-conducting body.

A first particularly simple embodiment of the invention is shown schematically in FIG. 1.

Since the degree of heat conduction of the magnet and the pole piece material is usually relatively poor, in the case of selective temperature control, a temperature gradient can form in the magnet material that has a negative impact during NMR measurements. For the same reason, convection is intended to be avoided. Therefore, according to the invention, heaters and thermoelectric coolers, as are described in the prior art, on the magnet are dispensed with. Instead, homogeneous heat radiation and heat conduction through the medium encompassing the magnet (generally fluid/gas/insulation body) is desired. Therefore, in a preferred embodiment, the temperature of the magnet is not controlled, and instead the temperature of the environment is fully and homogeneously controlled. In particular, the temperature of the wall in the air gap is also controlled.

In order to adjust the magnet temperature initially, additional temperature-control arrangements can be positioned directly on the magnet and/or the pole pieces, which are, however, deactivated after a start phase after the MR spectrometer has been switched on. Such additional temperature-control elements are advantageous for considerably decreasing the time needed for initial control of the temperature of the magnet.

Figure 2:
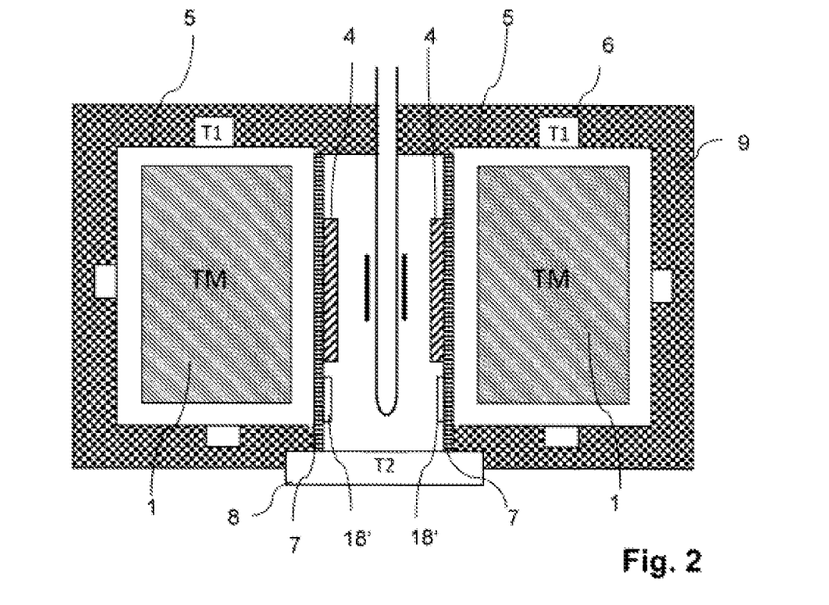
FIG. 2 shows a permanent magnet arrangement, the temperature of which is controlled as per the invention, comprising additional T2 control, a piece of thermal insulation and a closed air gap.

FIG. 2 shows a preferred embodiment of the system according to the invention, in which the first insulation chamber 1 is also encompassed by a piece of passive thermal insulation 9 towards the outside. Towards the probehead region, i.e., inside the inner contour of the magnet, there is arranged at least one shim system 4 and one heat-conducting system having at least one heat-conducting body 7. The heat-conducting body 7 is thermally connected to an arrangement 8 controlling the temperature T2 of the heat-conducting body 7, which can be a heater or a thermoelectric cooler having a heat exchanger towards the environment. Similarly to T1, T2 is set to a temperature of between 15° C. and 35° C. A piece of passive insulation can also be attached on the side facing the magnet system and on one or both sides of the heat-conducting body and is used to act as a low-pass filter for the magnet temperature and to restrict the heat-flow to the environment.

The heat-conducting body 7 can comprise a homogenization body 10 made of a material (for example Cu, Al, $Al_2O_3$, ... ) having a good thermal conductivity and/or can be designed having a heat-conducting device 17 in the form of a heatpipe, in which a fluid is present, which fluid is evaporated or condensed depending on the temperature inside the heatpipe and heat can therefore be transported. The heat-conducting body 7 is arranged between the shim system 4 and the magnet such that it forms a thermal shield between the permanent magnet arrangement 1 and the shim system and therefore forms the part of the first insulation chamber that is inside the inner contour of the permanent magnet.

In a preferred embodiment, the central air gap 2 is closed on the outside by the NMR probehead 3. This is not a hermetic seal, but the opening on the outside is designed such that minimum air exchange between the environment and the air gap is ensured. When the NMR sample tube is inserted, the gap to the housing is therefore preferably restricted to 1/10 mm.

A temperature is subsequently set in the air gap 2 that is near to T2, which is near to, preferably identical to, the temperature T1, in particular when the dissipation is conducted away by the heat-conducting body with electrical currents in the shim system and the H0 coil. This is advantageous since the test sample temperature is therefore close to room temperature during operation and the amount of time to reach a constant test sample temperature after a test sample has been introduced is as short as possible.

The shim system 4 consists of a multiplicity of (not shown in more detail in the drawings) shim coils and is preferably thermally coupled to the heat-conducting system. Furthermore, this embodiment having a closed probe head can advantageously be operated via a lock sample, which then also comprises a second transmitter/receiver coil that encompasses the lock sample and/or can generate an RF signal in the lock sample and can receive an RF signal from the lock sample, and at least one additional (likewise not shown) H0 coil, which is thermally coupled to the heat-conducting system and which is adjusted to frequency changes in the lock sample with varying currents. Supplying the H0 coils with power would lead to an input of heat into the magnet region, which is why the thermal shielding of the shim system 4 has proven to be particularly advantageous here. Such an increase in temperature by accurately adjusting currents in the shim coils leads to poor convergence of a shim algorithm, for example. Controlling the current in the H0 coil(s) can lead to "(de)shimming" of the magnet because of thermally generated gradients in the magnet material. In alternative embodiments, the shim system and/or H0 coils are not coupled to the heat-conducting body. The heat resulting from electrical dissipation can be removed from the air gap, e.g., in a non-controlled manner, by other heat-conducting bodies, and given to the room temperature, for example through a heat exchanger.

Figure 3:
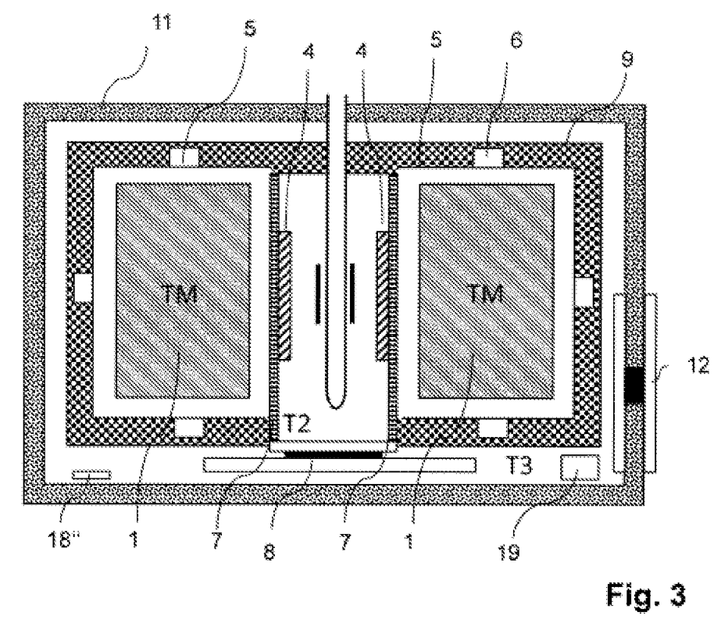
FIG. 3 shows an embodiment of the invention comprising a second insulation chamber, a closed air gap as well as additional T3 control.

FIG. 3 shows an extended design of the embodiment in FIG. 2. In this case, a second insulation chamber 11 is additionally provided, which encompasses the first insulation chamber 5. Furthermore, in this example, a thermoelectric cooler having a heat exchanger that exchanges heat with the air inside the second insulation chamber 11 is shown as the arrangement 8 controlling the temperature T2. The second insulation chamber 11 is controlled at a temperature T3 with a temperature control device 12, preferably also with a thermoelectric cooler and a heat exchanger to the room temperature.

The second insulation chamber 11 ensures that the area around the magnet can be used as a heat sink irrespective of how warm it actually is in the room. As a result, the isotherm around the magnet can always be achieved by heating and does not also need to be cooled. This is undoubtedly always sufficient for controlling the temperature T1, since no heat is introduced in the first insulation box except for by the shim system, H0 coil and a variable test sample temperature that may be present. These heat sources are coupled to the heat-conducting body to the greatest possible extent and therefore only affect the control of the temperature T2.

A thermoelectric cooler comprising heat exchangers on both sides of the wall is used to control the temperature at T3 of the second insulation chamber 11. This also fulfils another important purpose: it is responsible for a first reduction in the fluctuations in the room temperature, which allows the temperature of the isothermal wall and the shim system 4/the H0 coils to be accurately controlled at the temperatures T1 and T2, without placing high demands on the temperature of the area around the spectrometer. In order to be able to reach the temperature T3 with as little power as possible, it is reasonable to provide a piece of passive insulation that has sufficient dimensions as the wall of the second insulation chamber.

Furthermore, in these embodiments, a thermoelectric cooler having a heat exchanger for the second insulation chamber 11 can be provided to generate the temperature T2. This is advantageous, for example, if the temperature difference and size of the heat exchanger are insufficient to have enough thermal lift to cool the shim system 4 and/or the H0 coil and/or the heat input as a result of a variable test sample temperature, for example.

Preferably, the first insulation chamber 5 is made of a material having good thermal conductivity. This is advantageous since the heat radiation on the magnet from outside is as homogeneous as possible, and therefore no temperature gradients occur on the magnet.

The second insulation chamber 11 preferably contains an arrangement circulating the air 19 (for example one or multiple fans) inside the second insulation chamber 11. This allows for temperature distributions that are as homogeneous as possible and can ensure a flow of air through the heat exchanger(s).

Figure 4:
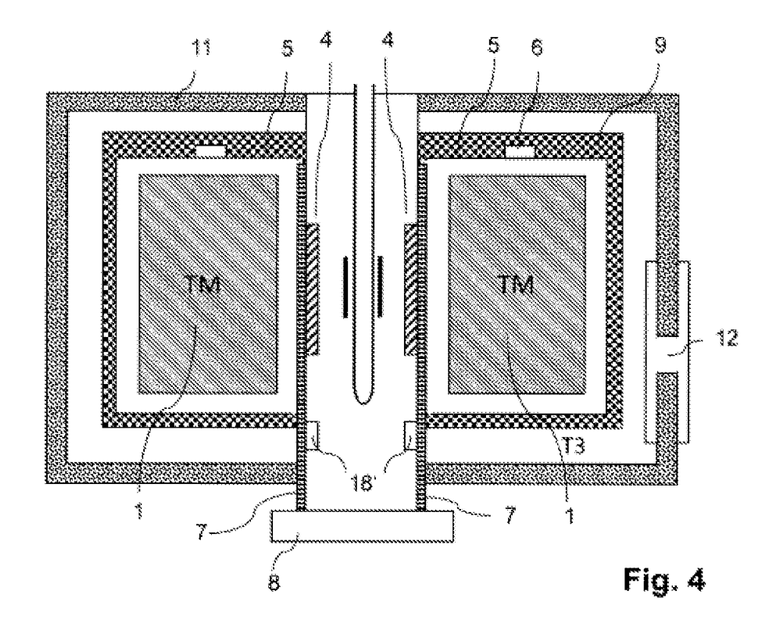
FIG. 4 shows an embodiment having two insulation chambers, an open air gap, T1, T2 and T3 control and in which the temperature of the heat-conducting body is controlled in relation to the ambient temperature.

In an alternative design—as shown in FIG. 4—the arrangement 8 controlling the temperature T2 can also control said temperature with respect to the external temperature. Furthermore, FIG. 4 shows an open sample chamber and therefore the temperature of the sample can also be controlled in this embodiment. A corresponding probehead having the necessary arrangement controlling the temperature of the test samples is not shown in FIG. 4 for reasons of clarity, but is shown separately in FIGS. 5A and 5B.

If the arrangement controlling the temperature T2 in relation to the external temperature and the NMR probehead 3 to the top are formed as separate chambers, the advantage lies in the fact that, at high thermal load, the probehead does not reach the second insulation chamber 11 and therefore the arrangement of the temperature control device 12 controlling the temperature T3 (thermoelectric cooler) of the second insulation chamber 11 can be smaller. This is particularly applicable if, in addition to the dissipation of the shim system 4/H0 coil, a large amount of heat load is also introduced by controlling the sample temperature. The thermal control of the shim system 4 can be carried out in two stages once again, wherein small additional heaters are used. When the heat is dissipated with respect to the room temperature, the stability with which T2 is controlled can be increased by using a cascaded system of thermoelectric coolers.

FIGS. 5A and 5B are cross-sections showing a schematic longitudinal section through the sample chamber comprising the shim system 4 and heat-conducting body 7 in two embodiments in which the temperature of the sample is controlled with a VT gas flow 16.

For optional control of the temperature of the test sample TS (with TS in the range of from −40 to +150° C.), another thermal insulation system 14 is required, which separates the test sample temperature-control space from the shim system 4. This is made of a material having poor thermal conduction (for example a vacuum, an aerogel, foam, glass, plastics material, . . . ) and optionally contains a second gas flow in the form of a temperature-controlled flush gas flow 15 having a temperature TF, which is preferably between 15° C. and 35° C.

In both embodiments shown, a central pipe is additionally provided for controlling the temperature of the sample, which cylindrically encompasses the sample tube that is generally elongate. Such a central pipe is advantageous in that, in addition to the canalization of the VT gas flow, it can also be used to collect escaping liquid and broken glass in the event that a test sample is broken or of a leak in the flow cells/test samples, so that they can be removed more easily.

The thermal insulation system 14 is arranged between the RF coils 13 and the shim system 4.

FIG. 5A shows an embodiment in which the central pipe is made of material having poor thermal conductivity and a piece of insulation is produced between the flush gas and the VT gas. The flush gas/fluid flow regions are arranged between the central pipe and the piece of thermal insulation in this case, since the temperature gradient can therefore be minimized with the piece of thermal insulation. For the purpose of improving temperature gradients inside the test sample, however, it may make more sense to channel the flush gas flow outside the piece of thermal insulation, for example between this and the shim system, as shown in FIG. 5B. It is also feasible to implement a combination of both configurations and to use a third gas flow having a temperature near to TS, or between TS and TF.

FIG. 5A shows an embodiment in which the test sample temperature can be directly set by temperature-control gas. In FIG. 5B, the temperature is indirectly controlled. This can be useful in particular for generating a hermetically sealed sample chamber, as is used for example for toxic test samples in order to prevent contamination in the event of a test sample being broken.

Ideally, the temperature TF of the flush gas flow is approximately equal to the temperature T2 so as to be able to make it possible to input as little heat as possible into the heat-conducting body.

Lastly, FIG. 6A-6C show different cross sections through embodiments of the NMR probehead 3 comprising the shim system 4, in which the heat-conducting body 7 comprises a homogenization body 10 and a heat-conducting device 17 in each case:

FIG. 6A shows a heat-conducting body 7 comprising two homogenization bodies 10 and two heat-conducting devices 17 for transferring the heat to the outside. The task of the homogenization body 10, which is in plate form, is to conduct the resultant heat in the plane to the heat-conducting devices 17. Since the distance is relatively short, the thickness of this body can be reduced.

In FIG. 6B, the heat-conducting devices 17 each comprise two heat pipes, as a result of which the conduction of heat in the direction perpendicular to the cut plane can be significantly increased.

FIG. 6C schematically shows a geometry for Halbach magnets having a concentric structure, for example. In this case, the heat-conducting body does not separately consist of a homogenization body 10 and a heat-conducting device 17, but heat pipes can also be soldered on or hollow-cylindrical heat pipes can be used in order to improve the transport of heat in the direction perpendicular to the plane of the drawing.

The heat-conducting body 7 is preferably thermally connected to a homogenization body 10. This is in particular made of a material having a high degree of heat conduction in order to set as homogeneous a temperature T2 as possible along the entire outer contour of the homogenization body 10 (oriented towards the magnet).

The heat-conducting device 17 is connected to a heat exchanger and is used to transport heat to, or remove it from, the homogenization body 10. The heat-conducting device 17 is preferably made of a material having a high degree of thermal conductivity or constructed as a heat pipe.

The shim system and/or the H0 coil is/are preferably directly thermally coupled to the heat-conducting body 7, in particular to the homogenization body 10. This can therefore ensure that the dissipation that occurs during operation as a result of electrical currents can be guided out of the central air gap efficiently.

An notable difference with respect to known devices of the prior art lies in controlling the temperature T2, which "is seen" from the inner contour of the magnet. Furthermore, it is novel to introduce a piece of thermal insulation between the sample temperature-control chamber and the shim system. It is clear from the above-cited documents that, in the prior art, the piece of insulation is always placed between the test sample and the inner wall of a sample temperature-control chamber, but especially inside the transmitter/receiver coil.

The features of all the above-described embodiments of the invention can also be combined
at least for the most part.

LIST OF REFERENCES

Documents Taken into Consideration when Assessing Patentability

[1] US 2011/0137589 A1
[2] U.S. Pat. No. 8,461,841 B2
[3] U.S. Pat. No. 6,489,873 B1
[4] U.S. Pat. No. 6,566,880 B1 and WO 2000/016117 A1
[5] GB 2512328 A
[6] U.S. Pat. No. 8,030,927 B2
[7] U.S. Pat. No. 7,297,907 B2
[8] US 2013/0207657 A1
[9] U.S. Pat. No. 9,285,441 B1
[10] US 2011/0037467 A1
[11] US 2018/0038924 A1
[12] US 2016/0077176 A1

LIST OF REFERENCE SIGNS 0 test sample
1 permanent magnet arrangement
2 central air gap
3 NMR probehead
4 shim system (with integrated H0 coil)
5 first insulation chamber
6 arrangement controlling the temperature T1
7 heat-conducting body
8 arrangement controlling the temperature T2
9 passive thermal insulation
10 homogenization body
11 second insulation chamber
12 temperature control device
13 RF coil
14 thermal insulation system
15 temperature-controlled flush gas flow
16 temperature-controlled VT gas flow
17 heat-conducting device
18 T-sensor for measuring T1
18' T-sensor for measuring T2
18" T-sensor for measuring T3
19 arrangement circulating the air

What is claimed is:

1. A temperature-control system for nuclear magnetic resonance (NMR) magnet system, comprising:
a permanent magnet arrangement with a central air gap and configured to generate a homogeneous static magnetic field having an amplitude in a measuring volume inside the central air gap, an NMR probehead configured to transmit radio frequency (RF) pulses and to receive RF signals from a test sample,
an H0 coil configured to change the amplitude of the static magnetic field, a shim system arranged in the central air gap and configured to further homogenize the magnetic field in the measuring volume,
a first insulation chamber surrounding and thermally shielding the permanent magnet arrangement,
wherein the first insulation chamber comprises at least one arrangement controlling a temperature T1 of the first insulation chamber, and wherein the shim system, the H0 coil and the NMR probehead are arranged outside the first insulation chamber in the central air gap, and at least one heat-conducting body defining two sides and arranged between the shim system and the H0 coil on one of the sides and the permanent magnet arrangement on the other of the sides.

2. The temperature-control system as claimed in claim 1, further comprising at least one arrangement controlling a temperature T2 of the heat-conducting body arranged outside the first insulation chamber.

3. The temperature-control system as claimed in claim 2, wherein the first insulation chamber that envelopes the permanent magnet arrangement comprises a wall having at least two respective, thermally separated faces, each of which comprises at least one respective sensor that determines a surface temperature T1i of the wall, and wherein the respective faces are thermally controlled independently of one another, one of the at least two thermally separated faces encompassing the central air gap that encompasses the measuring volume and actively thermally separates the shim system, the H0 coil and the NMR probehead from the permanent magnet arrangement.

4. The temperature-control system as claimed in claim 2, wherein the first insulation chamber that envelopes the permanent magnet arrangement comprises a wall, and wherein at least one of the arrangements controlling the temperature T1 of the first insulation chamber or the temperature T2 of the heat-conducting body is a thermoelectric cooler and comprises a heat exchanger, which ensures a flow of heat between the wall of the first insulation chamber during operation.

5. The temperature-control system as claimed in claim 1, wherein the first insulation chamber that envelopes the permanent magnet arrangement comprises a wall, and wherein the wall of the first insulation chamber is configured as a shielding arrangement for magnetically shielding the magnetic field with respect to an external space.

6. The temperature-control system as claimed in claim 5, wherein the shielding arrangement comprises a passive thermal insulation on an outer side of the first insulation chamber.

7. The temperature-control system as claimed in claim 1, wherein the heat-conducting body consists essentially of a homogenization body and a heat-conducting device.

8. The temperature-control system as claimed in claim 7, wherein the heat-conducting device comprises at least one heat pipe.

9. The temperature-control system as claimed in claim 7, wherein the homogenization body is thermally connected to the shim system and the H0 coil.

10. The temperature-control system as claimed in claim 7, wherein at least part of the homogenization body is arranged between the shim system and the permanent magnet arrangement.

11. The temperature-control system as claimed in claim 2, wherein the arrangement controlling the temperature T2 in the central air gap comprises a heater and/or a thermometer that measures the temperature T2, and is thermally connected to the shim system and/or to a heat-conducting system.

12. The temperature-control system as claimed in claim 1, wherein the first insulation chamber is encompassed by a second insulation chamber, which is at a temperature T3 and with which the temperature T3 inside the second insulation chamber is insulated with respect to an ambient temperature TR outside the second insulation chamber.

13. The temperature-control system as claimed in claim 12, further comprising a temperature control device on an outer wall of the second insulation chamber, which controls the temperature T3 inside the second insulation chamber with respect to the ambient temperature TR outside the second insulation chamber.

14. The temperature-control system as claimed in claim 1, wherein the probehead comprises an arrangement setting a temperature TS of the test sample in the measuring volume.

15. The temperature-control system as claimed in claim 14, wherein the temperature TS of the test sample in the measuring volume is set independently of a temperature of a wall of the first insulation chamber enveloping the permanent magnet arrangement.

16. The temperature-control system as claimed in claim 14, further comprising an insulation system arranged between the shim system and at least one RF coil of the NMR probehead.

17. The temperature-control system as claimed in claim 16, wherein the insulation system is configured with a flush gas flow, a temperature of which is controlled at a temperature TF, arranged to flow through the NMR probehead, the shim system or the H0 coil.

\* \* \* \* \*